(12) United States Patent
Tominaga et al.

(10) Patent No.: US 11,600,764 B2
(45) Date of Patent: Mar. 7, 2023

(54) VIBRATION STRUCTURE

(71) Applicant: Murata Manufacturing Co., Ltd., Nagaokakyo (JP)

(72) Inventors: Toru Tominaga, Nagaokakyo (JP); Junichi Hashimoto, Nagaokakyo (JP); Jun Endo, Nagaokakyo (JP); Shozo Otera, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 468 days.

(21) Appl. No.: 16/923,331

(22) Filed: Jul. 8, 2020

(65) Prior Publication Data

US 2020/0343437 A1  Oct. 29, 2020

Related U.S. Application Data

(63) Continuation of application No. PCT/JP2019/045265, filed on Nov. 19, 2019.

(30) Foreign Application Priority Data

Dec. 25, 2018 (JP) .............................. JP2018-240770

(51) Int. Cl.
  *H01L 41/047* (2006.01)
  *H01L 41/08* (2006.01)
(52) U.S. Cl.
  CPC ...... *H01L 41/0475* (2013.01); *H01L 41/0805* (2013.01)
(58) Field of Classification Search
  CPC ......................... H01L 41/0475; H01L 41/0805
  See application file for complete search history.

(56) References Cited

U.S. PATENT DOCUMENTS

2007/0044565 A1\* 3/2007 Aratake .................. H03H 9/21
  73/662
2011/0285250 A1\* 11/2011 Sugiyama ............ H03H 9/1021
  29/25.35
(Continued)

FOREIGN PATENT DOCUMENTS

JP  H05126626 A  5/1993
JP  2006197413 A  7/2006
(Continued)

OTHER PUBLICATIONS

Written Opinion of the International Searching Authority issued for PCT/JP2019/045265, dated Feb. 10, 2020.
(Continued)

*Primary Examiner* — Bryan P Gordon
(74) *Attorney, Agent, or Firm* — ArentFox Schiff LLP

(57) ABSTRACT

A vibration structure that includes a film having a first electrode on a first main surface thereof, the first electrode defining a first connection region on the first main surface where the first electrode is not present, and the film is constructed to be deformed in a plane direction when a voltage is applied thereto; a frame-shaped member; a vibration portion surrounded by the frame-shaped member; a first connection member that connects the first main surface of the film to the frame-shaped member at the first connection region; a second connection member that connects the film to the vibration portion; and an extended electrode that is connected to the first electrode.

14 Claims, 3 Drawing Sheets

(56) References Cited

U.S. PATENT DOCUMENTS

| | | | |
|---|---|---|---|
| 2012/0212756 A1 | 8/2012 | Chiba | |
| 2012/0306320 A1* | 12/2012 | Ichikawa | H03H 9/1021 |
| | | | 156/64 |
| 2014/0252919 A1* | 9/2014 | Ariji | H03H 9/19 |
| | | | 310/344 |
| 2018/0182949 A1* | 6/2018 | Kojima | H01L 41/0475 |

FOREIGN PATENT DOCUMENTS

| | | |
|---|---|---|
| JP | 2007306434 A | 11/2007 |
| JP | 2010263061 A | 11/2010 |
| JP | 2011233851 A | 11/2011 |
| JP | 2012175405 A | 9/2012 |
| JP | 2013078239 A | 4/2013 |

OTHER PUBLICATIONS

International Search Report Issued for PCT/JP2019/045265, dated Feb. 10, 2020.

* cited by examiner

VIBRATION STRUCTURE

CROSS REFERENCE TO RELATED APPLICATIONS

The present application is a continuation of International application No. PCT/JP2019/045265, filed Nov. 19, 2019, which claims priority to Japanese Patent Application No. 2018-240770, filed Dec. 25, 2018, the entire contents of each of which are incorporated herein by reference.

FIELD OF THE INVENTION

The present invention relates to a vibration structure.

BACKGROUND OF THE INVENTION

For example, Japanese Patent Application Laid-Open No. 5-126626 (Patent Document 1) discloses a structure in which a film-shaped piezoelectric body is connected to a substrate made of a rigid body in a piezoelectric vibration sensor.

The structure disclosed in Patent Document 1 has a film-shaped piezoelectric body composed of a piezoelectric body and electrodes that are integrally bonded to both main surfaces of the piezoelectric body using a dielectric adhesive, and a substrate disposed on the main surface of the film-shaped piezoelectric body. The substrate is made of a rigid body such as glass epoxy, and is integrally bonded on the electrode of the film-shaped piezoelectric body.

SUMMARY OF THE INVENTION

However, in a case where the film-shaped piezoelectric body is vibrated as an actuator using the inverse piezoelectricity of the piezoelectric body, the electrodes disposed on the surface of the film-shaped piezoelectric body come into direct contact with the substrate, which results in peeling of the electrodes due to the vibration, and thus reliability is reduced.

Therefore, the present invention provides a vibration structure for bonding a piezoelectric body and a substrate while suppressing a decrease in reliability.

A vibration structure based on the present invention includes a film having a first electrode on a first main surface thereof, the first electrode defining a first connection region on the first main surface where the first electrode is not present, and the film is constructed to be deformed in a plane direction when a voltage is applied thereto; a frame-shaped member; a vibration portion surrounded by the frame-shaped member; a first connection member that connects the first main surface of the film to the frame-shaped member at the first connection region; a second connection member that connects the film to the vibration portion; and an extended electrode that is connected to the first electrode.

With this configuration, the electrode is not present on the connection region in the plan view of the vibration structure, and thus there is no such a situation in which electrodes on the connection region peel off when the film expands or contracts.

In the vibration structure based on the present invention, it is possible to secure reliability of electrodes on a film.

DETAILED DESCRIPTION OF THE INVENTION

Figure 1A:
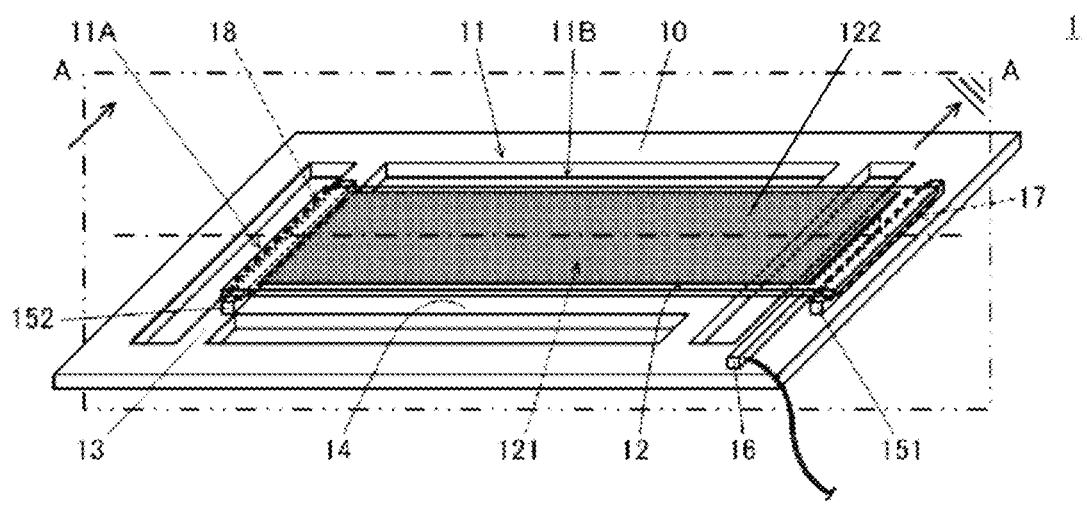
FIG. 1(A) is a perspective view of a vibration structure 1.
Figure 1B:
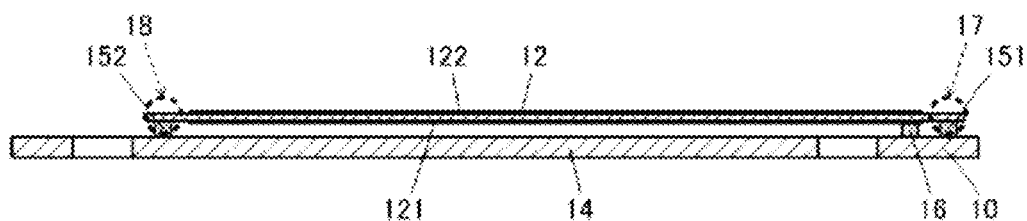
FIG. 1(B) is a cross-sectional view taken along line A-A of FIG. 1(A).

FIG. 1(A) is a perspective view of a vibration structure 1 according to a first embodiment of the present disclosure, and FIG. 1(B) is a cross-sectional view of the vibration structure 1 taken along line A-A of FIG. 1(A).

The vibration structure 1 includes a frame-shaped member 10, a region 11 surrounded by the frame-shaped member 10, a piezoelectric film 12, a first electrode 121, a second electrode 122, a support portion 13, a vibration portion 14, a first connection member 151 and a second connection member 152, an extended electrode 16, a first connection region 17, and a second connection region 18.

The frame-shaped member 10 has a rectangular shape in a plan view of the vibration structure, and has a region 11 surrounded by the frame-shaped member 10. Note that, in the region 11 surrounded by the frame-shaped member 10, the support portion 13 and the vibration portion 14 are disposed. In the region 11 surrounded by the frame-shaped member 10, two first openings 11A disposed at both ends of the frame-shaped member 10 in a longitudinal direction and two second openings 11B disposed at both ends of the frame-shaped member 10 in a short direction are formed by the support portion 13 and the vibration portion 14. The first opening 11A has a rectangular shape, and has a long shape along the short direction of the frame-shaped member 10. The second opening 11B has a rectangular shape, and has a long shape along the longitudinal direction of the frame-shaped member 10. Both ends of the second opening 11B in the longitudinal direction extend along a central axis of the frame-shaped member 10 (line A-A in the drawing).

The vibration portion 14 has a rectangular shape in the plan view, and is disposed in the region 11 surrounded by the frame-shaped member 10. The area of the vibration portion 14 is smaller than the area of the region surrounded by the frame-shaped member 10.

The support portion 13 connects the vibration portion 14 and the frame-shaped member 10 so that the vibration portion 14 is supported by the frame-shaped member 10. In this example, the support portion 13 has a rectangular shape that is long along the short direction of the frame-shaped member 10 and is a direction orthogonal to a direction in which the piezoelectric film 12 expands and contracts, and the support portions 13 hold the vibration portion 14 at both ends of the vibration portion 14 in the longitudinal direction.

In this example, the frame-shaped member 10, the vibration portion 14, and the support portion 13 are formed of the same material (for example, acrylic resin, PET, polycarbonate (PC), glass epoxy, FRP, metal, glass, or the like). That is, the frame-shaped member 10, the vibration portion 14, and the support portion 13 are formed by punching a single rectangular-shaped plate member along the shapes of the first openings 11A and the second openings 11B. The frame-shaped member 10, the vibration portion 14, and the support portion 13 may be formed of different materials, but can be easily manufactured by being formed of the same material. Alternatively, by forming the frame-shaped member 10, the vibration portion 14, and the support portion 13 using the same material, it is not necessary to use another material (material having creep deterioration) such as rubber for supporting the vibration portion 14, and it is possible to hold the vibration portion 14 for a long period of time. Further, in a case where punching is performed on the same material, the natural vibration periods of a plurality of support portions 13 are exactly the same, so that it is possible to reduce the vibration variation of the vibration portion 14. However, in the present invention, these members need not be formed of the same material. For example, in a case where a different material is used for the plurality of support portions 13, it is possible to adjust the movement of the vibration portion 14. For example, when a material having a high elastic coefficient such as rubber is used for the support portion 13, it is possible to reduce the magnitude of the voltage applied to the piezoelectric film 12.

The piezoelectric film 12 is connected to the frame-shaped member 10 and the vibration portion 14. The piezoelectric film 12 is a film that is deformed in the plane direction thereof when a voltage is applied thereto. The piezoelectric film 12 has a rectangular shape that is long along the longitudinal direction of the frame-shaped member 10 in the plan view. The piezoelectric film 12 is made of, for example, polyvinylidene fluoride (PVDF). Further, the piezoelectric film 12 may be made of a chiral polymer. As the chiral polymer, for example, poly-L-lactide (PLLA) or poly-D-lactide (PDLA) is used.

In a case where PVDF is used for the piezoelectric film 12, since PVDF has water resistance, it is possible to cause electronic equipment including the vibration member in this example to vibrate similarly under any humidity environment.

In addition, in a case where PLLA is used for the piezoelectric film 12, since PLLA is a highly transmissive material, if the electrodes and the vibration portion are also transparent materials, the internal state of the equipment can be visually recognized, and thus manufacturing becomes easy. Further, since PLLA has no pyroelectricity, it is possible to cause the piezoelectric film to vibrate similarly under any temperature environment.

For example, in a case where the piezoelectric film 12 is made of PLLA, the piezoelectric film 12 has piezoelectricity by being cut such that each outer periphery is approximately 45° with respect to the stretching direction.

A first end of the piezoelectric film 12 in the longitudinal direction is connected to a first end of the frame-shaped member 10 in the longitudinal direction, which is on the right side in the FIG. 1(A). A second end of the piezoelectric film 12 in the longitudinal direction is connected to a second end of the vibration portion 14 in the longitudinal direction, which is on the left side in FIG. 1(A).

The piezoelectric film 12 is deformed in the plane direction when a voltage is applied. Specifically, the piezoelectric film 12 expands and contracts in the longitudinal direction when a voltage is applied. When the piezoelectric film 12 expands and contracts in the longitudinal direction, the vibration portion 14 is vibrated in the longitudinal direction.

The piezoelectric film 12 has plane electrodes formed on both main surfaces. The first electrode 121 is formed on the main surface facing the vibration portion 14, and the second electrode 122 is formed on the main surface on a side opposite to the vibration portion 14. When a voltage is applied from the outside to the first electrode 121 and the second electrode 122, the piezoelectric film 12 expands and contracts.

As illustrated in FIG. 1(B), the piezoelectric film 12 is connected to the frame-shaped member 10 and the vibration portion 14 with the connection members 151 and 152 interposed therebetween. Each of the connection members 151 and 152 has a rectangular shape that is long along the short direction of the frame-shaped member 10 in the plan view. The first connection member 151 connects the piezoelectric film 12 and the frame-shaped member 10, and the second connection member 152 connects the piezoelectric film 12 and the vibration portion 14. The first connection member 151 and the second connection member 152 have a certain thickness, and respectively connect the piezoelectric film 12 and the frame-shaped member 10, and the piezoelectric film 12 and the vibration portion 14 at a certain distance such that the piezoelectric film 12 does not come into contact with the vibration portion 14, the frame-shaped member 10, and the support portion 13. In this manner, it is difficult for the electrodes provided on both main surfaces of the piezoelectric film 12 to come into contact with the vibration portion 14, so that even if the piezoelectric film 12 expands and contracts and the vibration portion 14 is vibrated, the electrodes can be prevented from being scraped. In a case where the frame-shaped member 10, the support portion 13, and the vibration portion 14 are conductive members, it is preferable to dispose an insulating member or a coating film between the connection members 151, 152 and the frame-shaped member 10, the support portion 13, and the vibration portion 14. In this case, it is possible to prevent an electrical short circuit between the electrode of the piezoelectric film 12 and the frame-shaped member 10, the support portion 13, and the vibration portion 14.

The connection members 151 and 152 are made of, for example, metal, PET, polycarbonate (PC), polyimide, or ABS resin. The connection members 151 and 152 connect the piezoelectric film 12 and the vibration portion 14 and the piezoelectric film 12 and the frame-shaped member 10 using an adhesive or the like. Note that it is not essential to connect the connection members 151 and 152 and various components using an adhesive or the like. For example, the connection members 151 and 152 themselves may be an adhesive or a double-sided tape. In this case, it is not necessary to separately prepare an adhesive or the like. For the connection members 151 and 152, a thermosetting resin may also be used. In FIGS. 1(A) and 1(B), and discussed in more detail below, the first connection member 151 and the second connection member are directly bonded to a location of the piezoelectric film 12 where no electrode is provided.

The piezoelectric film 12 is connected to the frame-shaped member 10 and the vibration portion 14 with the connection members 151 and 152 interposed therebetween in a state where a certain amount of tension is applied. However, it is not essential that the piezoelectric film 12 is connected while being tensioned. The piezoelectric film 12 may be connected such that tension is applied only when the piezoelectric film 12 contracts.

In addition, the first connection member 151 connects the piezoelectric film 12 and the frame-shaped member 10 in the first connection region 17. In the plan view of the piezoelectric film 12, the first connection region 17 includes a location where the first electrode 121 and the second electrode 122 are not formed at the first end of the piezoelectric film 12 in the longitudinal direction, and a location where the first connection member 151 is disposed.

Since no electrode is formed on the first connection region 17, even in a case where the piezoelectric film 12 contracts and a force is applied between the first connection member 151 and the piezoelectric film 12, it is possible to suppress the occurrence of peeling or the like caused by force directly applied to the electrode. Further, since a location of the piezoelectric film 12 where the first connection member 151 is disposed is less likely to expand and contract as compared with a location of the piezoelectric film 12 where the first connection member is not disposed, stress may be applied to the electrode formed on the piezoelectric film 12 at the boundary of the first connection member 151 when the piezoelectric film 12 expands and contracts. In the configuration of the vibration structure 1, since no electrode is disposed on the first connection member 151, it is possible to suppress the occurrence of peeling or the like caused by stress applied to the electrode at the boundary of the first connection member when the piezoelectric film 12 expands and contracts.

Therefore, conduction of the electrodes formed on the piezoelectric film 12 is more easily secured, and the reliability is improved.

In the piezoelectric film 12, the first electrode 121 is formed on the main surface facing the vibration portion 14, and the second electrode 122 is formed on the main surface on a side opposite to the vibration portion 14. When a voltage is applied from the outside to the first electrode 121 and the second electrode 122, the piezoelectric film 12 expands and contracts.

The extended electrode 16 is connected to the electrodes of the piezoelectric film 12. The extended electrode 16 is further connected to a drive unit (not illustrated). A drive signal is applied from the drive unit to the electrodes of the piezoelectric film 12 through the extended electrode 16, and the piezoelectric film 12 expands and contracts.

The extended electrode 16 is disposed closer to the vibration portion 14 than the first connection member 151. Since the electrodes are not disposed on the piezoelectric film 12 at the location of the first connection member 151, the extended electrode 16 is disposed closer to the vibration portion 14 than the first connection member 151, and is connected to the electrode of the piezoelectric film 12.

The extended electrodes 16 may be extended from the first electrode 121 and the second electrode 122, respectively. Further, the extended electrodes may overlap by being extended from the same location of the first electrode 121 and the second electrode 122. In this case, the extended electrode extended from the first electrode 121 and the extended electrode extended from the second electrode 122 overlap by being insulated so as not to be short-circuited. The extended electrode 16 is preferably extended in a direction perpendicular to the vibration direction of the vibration portion 14.

The extended electrode 16 extended from the electrode of the piezoelectric film 12 extends to a region where the piezoelectric film is not disposed in the plan view of the frame-shaped member 10. The extended electrode may be further connected from the location where the extended electrode is extended to the outside by a connection wire or the like, or a connection terminal may be provided at an end of the extended electrode 16.

The piezoelectric film 12 is connected to the frame-shaped member 10 by the first connection member 151. In the plan view of the main surface of the piezoelectric film 12, the first electrode 121 and the second electrode 122 are not formed in the first connection region 17 on the first connection member 151. Furthermore, in the plan view of the main surface of the piezoelectric film 12, the first electrode 121 and the second electrode 122 are not formed in the second connection region 18 at the location of the second connection member 152.

With this configuration, it is possible to suppress that the first electrode 121 and the second electrode 122 on the piezoelectric film 12 directly apply a force to a portion connected to the first connection member 151 and the second connection member 152, and the reliability is improved.

In FIG. 1(A), an example in which the first electrode 121 and the second electrode 122 are not formed on the first connection member 151 in the first connection region 17 has been described, but the invention is not limited thereto, and a configuration in which the electrode is not formed in a region where the second connection member 152 is connected to the piezoelectric film 12 may be adopted.

In that case, the difficulty of peeling of the electrode is further improved, and the reliability is increased. The above-described vibration structure 1 is vibrated in the plane direction within the region 11 where the vibration portion 14 is surrounded by the frame-shaped member 10. Therefore, as illustrated in FIG. 1(B), the entire thickness of the vibration structure 1 is the thickness of the piezoelectric film 12, the thickness of the connection members 151/152, and the thickness of the vibration portion 14, and becomes extremely thin. Further, the piezoelectric film 12 is elastic and has impact resistance. Further, in a case where the frame-shaped member 10, the vibration portion 14, and the support portion 13 are formed of a single rectangular-shaped same plate material, it is not necessary to use another material (material having creep deterioration) such as rubber for supporting the vibration portion 14. Therefore, according to the structure of the vibration structure 1, stable vibration can be performed for a long period of time.

The shape of the vibration portion 14 is not limited to the shape illustrated in FIG. 1(A). The frame-shaped member 10 does not need to have an annular shape that surrounds the entire periphery in the plan view, and may have a partially open structure. Further, the frame-shaped member 10 and the vibration portion 14 do not need to have a rectangular shape in the plan view. The frame-shaped member 10 and the vibration portion 14 may have a polygonal shape, a circular shape, an elliptical shape, or the like.

The piezoelectric film 12 is connected to the connection members 151/152 at both ends in the longitudinal direction so that amplitude can be increased, but it is not essential that the piezoelectric film 12 is connected to the connection members 151/152 at both ends in the longitudinal direction. Further, the longitudinal direction of the piezoelectric film 12 does not need to be along the vibration direction of the vibration portion 14. Further, while the example illustrated in FIG. 1(A) shows the piezoelectric film 12 covering the vibration portion 14 in the plan view, the vibration structure can be configured such that only a first end (the right end in the drawing) of the vibration portion 14 and the first end of the frame-shaped member 10 are connected.

Further, the support portion 13 only needs to support the vibration portion 14 at at least one location. Further, the number of the piezoelectric films 12 is not limited to one. The vibration structure 1 may include a plurality of piezoelectric films 12. In this case, the plurality of piezoelectric films 12 can be individually driven. Further, the plurality of piezoelectric films 12 may have a structure in which the piezoelectric films 12 are stacked on each other. In this case, an applied voltage may be applied to each layer of the plurality of piezoelectric films 12.

Figure 2A:
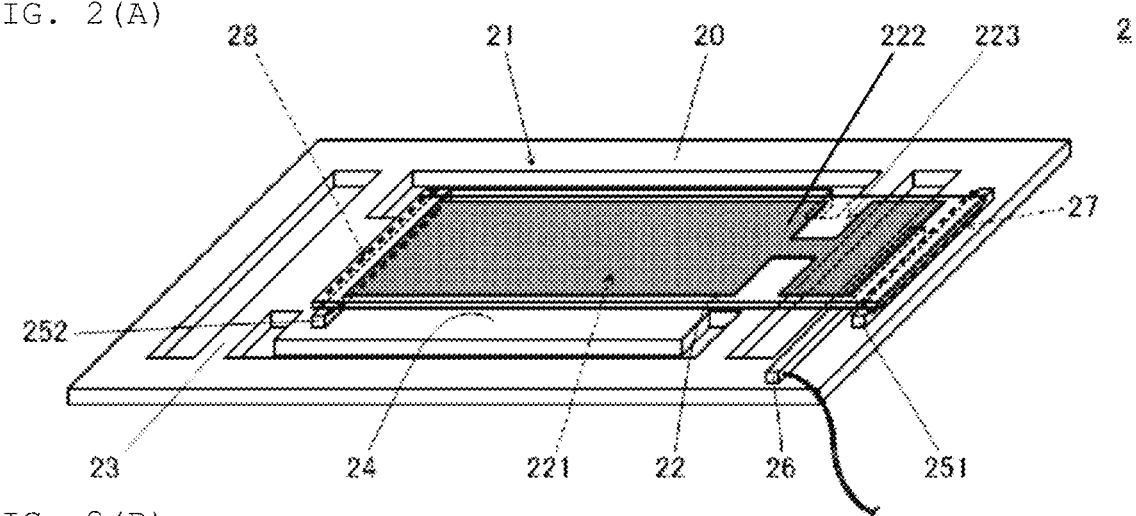
FIG. 2(A) is a perspective view of a vibration structure 2.
Figure 2B:
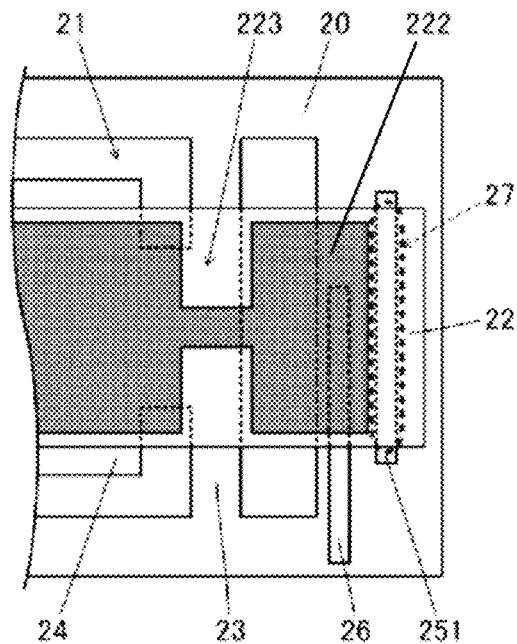
FIG. 2(B) is a plan view of the vibration structure 2.

FIG. 2(A) illustrates a perspective view of a vibration structure 2 according to a second embodiment of the present disclosure. FIG. 2(B) is a plan view of the vibration structure 2 in FIG. 2(A).

The vibration structure 2 includes a frame-shaped member 20, an opening 21, a piezoelectric film 22, a first electrode 221, a second electrode 222, a notch 223, a support portion 23, a vibration portion 24, a first connection member 251 and a second connection member 252, an extended electrode 26, a first connection region 27, and a second connection region 28.

The vibration structure 2 is different from the vibration structure 1 in that the notch 223 is provided on the piezoelectric film 22. Therefore, the following description focuses only on the difference.

The piezoelectric film 22 is connected to the frame-shaped member 20 in the first connection region 27 with the first connection member 251 interposed between the piezoelectric film 22 and the frame-shaped member 20. In addition, the piezoelectric film 22 is connected to the vibration portion 24 in the second connection region 28 with the second connection member 252 interposed between the piezoelectric film 22 and the vibration portion 24.

In the piezoelectric film 22, the first electrode 221 is disposed on the main surface facing the vibration portion 24, and the second electrode 222 is disposed on the main surface on a side opposite to the vibration portion 24.

The first electrode 221 and the second electrode 222 each have the notch 223. When the piezoelectric film 22, the first electrode 221, and the second electrode 222 are viewed in a plan view of the vibration structure 2, the notch 223 is provided closer to the vibration portion 24 than the first connection region 27. The notch 223 is preferably disposed in a region overlapping the support portion 23 in the plan view of the vibration structure 2.

Since the notch 223 is disposed in the region overlapping the support portion 23 in the plan view of the vibration structure 2, the electrodes of the piezoelectric film 22 are less likely to come into contact with the support portion 23. Thereby, the reliability of the vibration structure 2 is further improved.

Further, the extended electrode 26 is disposed between the first connection region 27 and the notch 223. The region of the piezoelectric film 22 where the notch 223 is provided does not expand or contract because the first electrode 221 and the second electrode 222 are not provided in the region. Therefore, the force and vibration applied to the extended electrode 26 due to the expansion and contraction of the piezoelectric film 22 are suppressed. As a result, the possibility that the extended electrode 26 is peeled off from the electrode of the piezoelectric film 22 is reduced, and the reliability of the vibration structure 2 is improved.

A plurality of notches 223 may be provided on the piezoelectric film 22 instead of a single notch. In this case, it is preferable that the support portion 23 is provided to overlap the notches 223 in the plan view of the vibration structure 2, but there is no limitation.

Further, the notch 223 may be provided at the location of the extended electrode 26. In this case, since a location where the piezoelectric film 22 and the extended electrode 26 are connected is less likely to be vibrated, the reliability is improved.

Figure 3A:
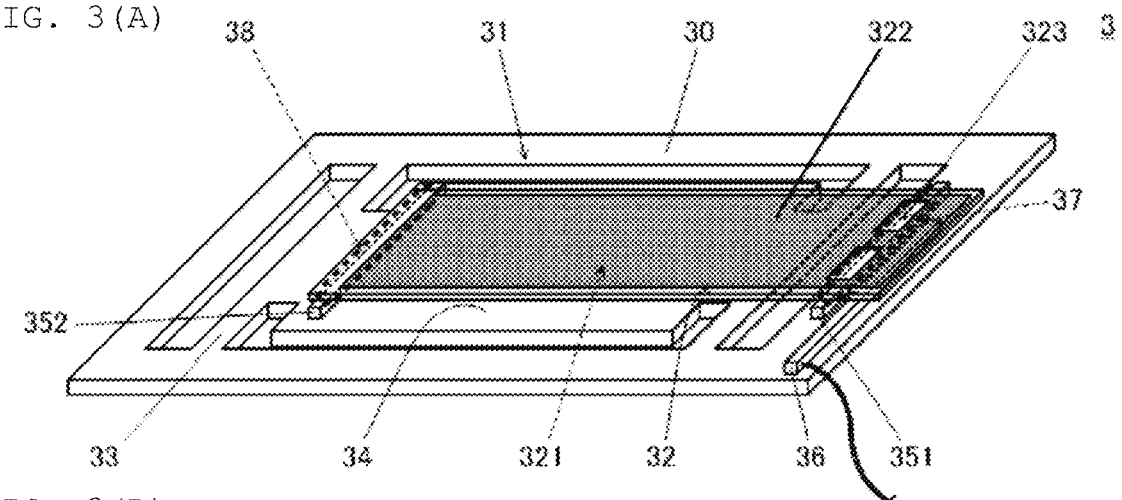
FIG. 3(A) is a perspective view of a vibration structure 3.
Figure 3B:
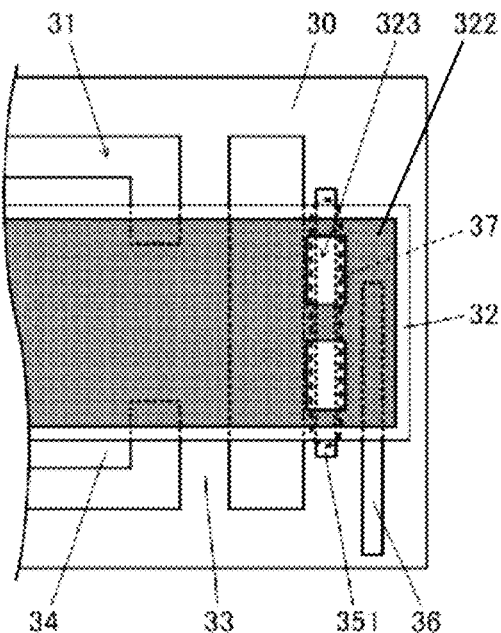
FIG. 3(B) is a plan view of the vibration structure 3.

FIG. 3(A) is a perspective view of a vibration structure 3 according to a third embodiment of the present disclosure. FIG. 3(B) is a plan view of the vibration structure 3 in FIG. 3(A).

The vibration structure 3 includes a frame-shaped member 30, an opening 31, a piezoelectric film 32, a first electrode 321, a second electrode 322, a notch 323, a support portion 33, a vibration portion 34, a first connection member 351 and a second connection member 352, an extended electrode 36, a first connection region 37, and a second connection region 38.

The vibration structure 3 is different from the vibration structure 2 in that the first connection region 37 and the first connection member 351 are disposed between the extended electrode 36 and the vibration portion 34, and further the notch 323 is disposed at the location of the first connection member 351.

Therefore, the following description focuses only on the difference between the vibration structure 2 and the vibration structure 3.

The piezoelectric film 32 is connected to the vibration portion 34 in the second connection region 38 with the second connection member 352 interposed between the piezoelectric film 32 and the vibration portion 34. Further, the piezoelectric film 32 is connected to the frame-shaped member 30 in the first connection region 37 with the first connection member 351 interposed between the piezoelectric film 32 and the frame-shaped member 30.

In the piezoelectric film 32, the first electrode 321 is disposed on the main surface facing the vibration portion 34, and the second electrode 332 is disposed on the main surface on a side opposite to the vibration portion 34.

The extended electrode 36 is connected to the electrode of the piezoelectric film 32 at the end on a side opposite to the second connection member 352 with the first connection member 351 of the piezoelectric film 32 interposed therebetween. The extended electrode 36 is connected to the electrode of the piezoelectric film 32 at the end on a side opposite to the second connection member 352 with the first connection member 351 of the piezoelectric film 32 interposed therebetween so that the extended electrode 36 is less likely to be affected by the vibration of the piezoelectric film 32 closer to the second connection member 352 than the first connection member 351. With this configuration, it is possible to suppress the influence of the vibration applied to the extended electrode 36 and the force applied with the vibration, and thereby the reliability is improved.

The notch 323 is provided on the first connection member 351 in the plan view of the vibration structure 3. In the plan view of the vibration structure 3, the first connection member 351 bonds the frame-shaped member 30 and the piezoelectric film 32 at the notch 323. With this configuration, even if the first connection member 351 is provided closer to the vibration portion 34 than the extended electrode 36, in a portion where the notch 323 is not provided it is possible to secure the conduction between the first electrode 321 and the second electrode 322, and the extended electrode 36, and to improve the reliability of the extended electrode 36.

Further, the first connection member 351 may be provided along the shape of the notch 323. That is, in a case where a plurality of rectangular-shaped notches 323 are arranged in the short direction in the plan view of the vibration structure 3, a plurality of rectangular-shaped first connection members 351 may be arranged in the short direction of the vibration structure 3 so as to overlap the notches 323. In this case, it is possible to suppress the reduction of the reliability due to the contact between the electrodes other than the notch 323 and the first connection member 351 during the driving of the vibration structure 3.

The characteristic configurations in the first to third embodiments of the present disclosure described above can be combined with each other without departing from the gist of the present invention.

The embodiments disclosed here are examples in all respects, and are not restrictive. The technical scope of the present invention is defined by the claims, and includes all modifications within the meaning and scope equivalent to the description of the claims.

DESCRIPTION OF REFERENCE SYMBOLS

1: vibration structure
10: frame-shaped member
11: surrounded region
12: piezoelectric film
121: first electrode
122: second electrode
13: support portion
14: vibration portion
15: connection member
151: first connection member
152: second connection member
16: extended electrode
17: first connection region

The invention claimed is:

1. A vibration structure comprising:
a film having a first electrode on a first main surface thereof, the first electrode defining a first connection region on the first main surface where the first electrode is not present, and the film is constructed to be deformed in a plane direction when a voltage is applied thereto;
a frame-shaped member;
a vibration portion surrounded by the frame-shaped member;
a first connection member that connects the first main surface of the film to the frame-shaped member at the first connection region;
a second connection member that connects the film to the vibration portion; and
an extended electrode that is connected to the first electrode.

2. The vibration structure according to claim 1, further comprising:
a second electrode on a second main surface of the film opposite to the first main surface of the film, and
the second electrode defining a second connection region on the second main surface where the second electrode is not present, the second connection region being opposite to the first connection region.

3. The vibration structure according to claim 1, wherein the first electrode defines a second connection region on the first main surface where the first electrode is not present, and the second connection member connects the film to the vibration portion at the second connection region.

4. The vibration structure according to claim 3, further comprising:
a second electrode on a second main surface of the film opposite to the first main surface of the film, and
the second electrode defining a third connection region on the second main surface where the second electrode is not present, the third connection region being opposite to the first connection region.

5. The vibration structure according to claim 1, wherein the second electrode defines a fourth connection region on the second main surface where the second electrode is not present, the fourth connection region being opposite to the second connection region.

6. The vibration structure according to claim 1, wherein the extended electrode is positioned between the first connection member and the second connection member.

7. The vibration structure according to claim 1, wherein the first connection member is positioned between the extended electrode and the second connection member.

8. The vibration structure according to claim 1, wherein the first connection member extends in a width direction orthogonal to the plane direction in which the film is constructed to be deformed.

9. The vibration structure according to claim 1, wherein the first connection member is a plurality of the first connection members disposed in a width direction orthogonal to the plane direction in which the film is constructed to be deformed.

10. The vibration structure according to claim 1, wherein an area of the vibration portion is smaller than an area of a region surrounded by the frame-shaped member in a plan view of the vibration structure.

11. The vibration structure according to claim 1, further comprising:
a support portion that connects the vibration portion and the frame-shaped member, and supports the vibration portion within the frame-shaped member.

12. The vibration structure according to claim 11,
wherein the support portion comprises a plurality of support portions disposed at different locations between the vibration portion and the frame-shaped member.

13. The vibration structure according to claim 12, wherein the first electrode includes a notch, and the notch overlaps a support portion closest to the first connection member in a plan view of the vibration structure among the plurality of support portions.

14. The vibration structure according to claim 11, wherein the first electrode includes a notch, and the notch overlaps the support portion in a plan view of the vibration structure.

* * * * *